US012590371B2

(12) United States Patent
Hsieh

(10) Patent No.: US 12,590,371 B2
(45) Date of Patent: Mar. 31, 2026

(54) SEMICONDUCTOR PROCESSING SYSTEM, AND CONTROL ASSEMBLY AND METHOD THEREOF

(71) Applicant: ENCHIP ENTERPRISE LLC, Chandler, AZ (US)

(72) Inventor: Julian Juuchuan Hsieh, Chandler, AZ (US)

(73) Assignee: ENCHIP ENTERPRISE LLC, Chandler, AZ (US)

( * ) Notice: Subject to any disclaimer, the term of this patent is extended or adjusted under 35 U.S.C. 154(b) by 109 days.

(21) Appl. No.: 18/456,229

(22) Filed: Aug. 25, 2023

(65) Prior Publication Data

US 2023/0399746 A1 Dec. 14, 2023

Related U.S. Application Data

(62) Division of application No. 16/939,788, filed on Jul. 27, 2020, now abandoned.

(51) Int. Cl.
*H01J 37/32* (2006.01)
*C23C 16/455* (2006.01)
*H10P 14/24* (2026.01)

(52) U.S. Cl.
CPC .. *C23C 16/45561* (2013.01); *C23C 16/45544* (2013.01); *C23C 16/45557* (2013.01); *H10P 14/24* (2026.01)

(58) Field of Classification Search
CPC ........................... C23C 16/52; C23C 16/45561
See application file for complete search history.

(56) References Cited

U.S. PATENT DOCUMENTS

| | | | |
|---|---|---|---|
| 5,470,390 A | 11/1995 | Nishikawa | |
| 2002/0007790 A1* | 1/2002 | Park | C23C 16/45565 134/37 |
| 2003/0109094 A1 | 6/2003 | Seidel | |
| 2004/0079286 A1* | 4/2004 | Lindfors | C23C 16/4481 118/715 |
| 2005/0061245 A1 | 3/2005 | Kim | |
| 2005/0091787 A1* | 5/2005 | Bair | A47L 9/165 15/353 |
| 2005/0193771 A1* | 9/2005 | Miura | C03C 10/00 65/33.2 |
| 2006/0154383 A1* | 7/2006 | Kannan | C23C 16/45557 257/E21.171 |
| 2007/0235085 A1* | 10/2007 | Nakashima | C23C 16/4408 137/240 |

(Continued)

*Primary Examiner* — Joseph A Miller, Jr.
(74) *Attorney, Agent, or Firm* — McDonnell Boehnen Hulbert & Berghoff LLP

(57) ABSTRACT

This disclosure relates to a semiconductor processing system, and control assembly and method thereof. The semiconductor processing system includes a mass flow controller (MFC), a control assembly and a process chamber. The MFC is coupled to a gas source to receive an input gas. The control assembly, which is coupled to the MFC, includes a charge chamber, an inlet valve and an outlet valve. The charge chamber is arranged to accommodate the input gas. The inlet valve is arranged to control a charge of the input gas for the charge chamber. The outlet valve is arranged to control a release of the input gas accommodated in the charge chamber. The process chamber is coupled to the outlet valve of the control assembly.

11 Claims, 12 Drawing Sheets

10

(56)  References Cited

U.S. PATENT DOCUMENTS

| | | | |
|---|---|---|---|
| 2012/0073672 A1* | 3/2012 | Ding | C23C 16/45523 |
| | | | 156/345.33 |
| 2014/0213069 A1 | 7/2014 | Takebayashi | |
| 2017/0056912 A1* | 3/2017 | Choi | C23C 16/4486 |
| 2017/0275757 A1 | 9/2017 | Kikuchi | |
| 2018/0142357 A1 | 5/2018 | Furusawa | |
| 2018/0179628 A1 | 6/2018 | Hashimoto | |
| 2018/0237911 A1 | 8/2018 | Narushima | |
| 2019/0071774 A1 | 3/2019 | Fukumaki | |
| 2019/0390333 A1* | 12/2019 | Nishida | H01L 21/0228 |

* cited by examiner

SEMICONDUCTOR PROCESSING SYSTEM, AND CONTROL ASSEMBLY AND METHOD THEREOF

RELATED DISCLOSURE

This disclosure is a divisional of, and claims priority to, U.S. patent application Ser. No. 16/939,788 filed Jul. 27, 2020, which is hereby incorporated by reference herein in its entirety.

TECHNICAL FIELD

This disclosure relates to semiconductor processing systems and methods.

BACKGROUND

In semiconductor manufacturing field, atomic layer deposition (ALD) is a popular technique for forming a thin film. However, it has been difficult to deliver precise and sufficient chemical dosage within a very short pulse time. The pulse time has routinely been relaxed to ensure sufficient dosage and consistency, with negative impact on processing speed, precise dosage tuning and chemical consumption. It is desirable to improve the processing method so that precise, repeatable and scalable chemical dosage can be controlled and delivered within a very short and fixed pulse time. Such improvement can lead to faster processing speed, precise tuning of chemical dosage and more efficient use of chemicals.

SUMMARY OF THE INVENTION

One of the objectives of the present disclosure is to provide a semiconductor processing system, a method of controlling the semiconductor processing system, and a control assembly of the semiconductor processing system to solve the problems mentioned above. Although some embodiments of the present disclosure are described with respect to an ALD system or ALD operation, it is contemplated that the solutions provided by the present disclosure can be applied to any other suitable semiconductor processing system.

In some embodiments, a semiconductor processing system is disclosed. The semiconductor processing system includes a mass flow controller (MFC), a control assembly and a process chamber. The MFC is coupled to a gas source to receive an input gas. The control assembly, which is coupled to the MFC, includes a charge chamber, an inlet valve and an outlet valve. The charge chamber is arranged to accommodate the input gas. The inlet valve is arranged to control a charge of the input gas for the charge chamber. The outlet valve is arranged to control a release of the input gas accommodated in the charge chamber. The process chamber is coupled to the outlet valve of the control assembly.

In some embodiments, a method of controlling a semiconductor processing system is disclosed. The semiconductor processing system includes a control assembly coupled between a gas source and a process chamber. The method includes operating in a process stage, which includes: activating an inlet valve of the control assembly coupled between the gas source and a charge chamber of the control assembly to charge the charge chamber with an input gas from the gas source; and activating a first outlet valve of the control assembly coupled between the charge chamber and the process chamber to release the input gas in the charge chamber into the process chamber.

In some embodiments, a control assembly of a semiconductor processing system is disclosed. The control assembly includes an inlet valve, an outlet valve and a charge chamber coupled between the inlet valve and the outlet valve. The inlet valve, which is coupled between a gas source and the charge chamber, is arranged to control a charge of an input gas from a gas source for the charge chamber. The outlet valve, which is coupled between the charge chamber and a process chamber, is arranged to control a release of the input gas in the charge chamber to the process chamber.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
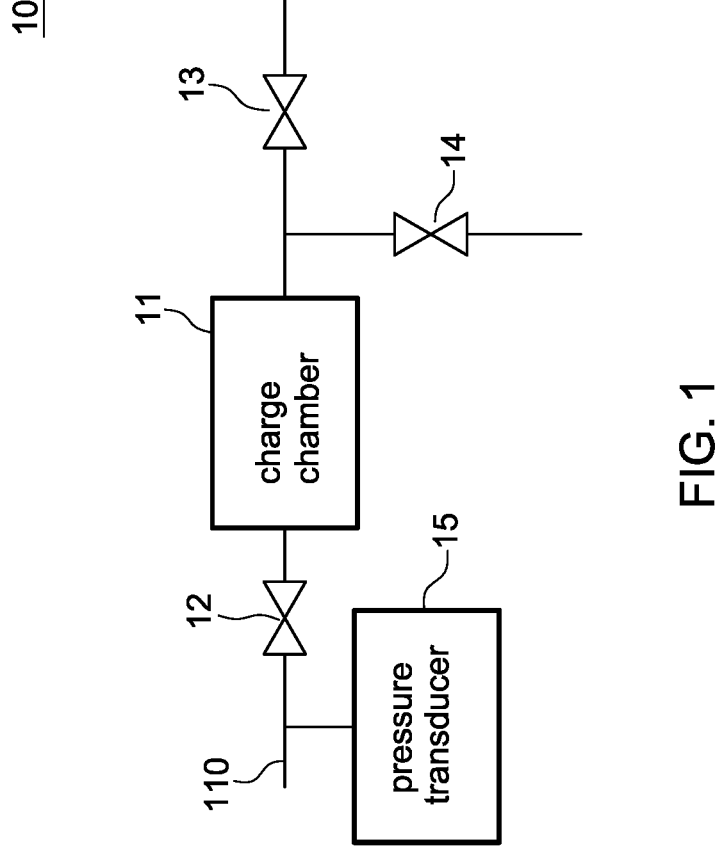
FIG. 1 is a diagram illustrating a control assembly in accordance with an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired.

At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

An atomic layer deposition (ALD) system relies on alternating dosage of chemicals to achieve film deposition. A precursor chemical is first delivered to a work piece (e.g., a semiconductor wafer) in a reactor, resulting in chemisorption of the precursor molecule. If sufficient precursor dosage is provided, the surface of the work piece becomes uniformly saturated with the precursor molecules. The reactor is then evacuated with a purge gas and then supplied with a reactant chemical that can remove unwanted ligands from the precursor molecules on the surface. This precursor/purge/reactant/purge sequence can be repeated multiple times and result in film deposition layer-by-layer until the desired film thickness is achieved.

FIG. 1 is a diagram illustrating a control assembly 10 in accordance with an embodiment of the present disclosure. In this present disclosure, the control assembly 10 is applied to a semiconductor processing system such as an ALD system. In some embodiments, the control assembly 10 is coupled between a gas source and a process chamber of the semiconductor processing system. In some embodiments, the control assembly 10 receives an input gas from the gas source, and releases the input gas into the process chamber for executing semiconductor processing (e.g., an ALD operation) upon the work piece (e.g., a semiconductor wafer) in the process chamber.

The control assembly 10 includes a charge chamber 11, an inlet valve 12, and outlet valves 13 and 14. The charge chamber 11, coupled between the inlet valve 12 and the outlet valves 13 and 14, is arranged to accommodate the input gas. The inlet valve 12, which is coupled to the gas source via a gas line 110, is arranged to control charge of the input gas from the gas source for the charge chamber 11. The outlet valves 13 and 14 are arranged to control release of the input gas in the charge chamber 11. The outlet valve 13 is coupled to the process chamber, and the outlet valve 14 is coupled to a dump line. Therefore, the outlet valve 13 controls the release of the input gas in the charge chamber 11 to the process chamber, and the outlet valve 14 controls the release of the input gas in the charge chamber 11 to the dump line.

In some embodiments, the control assembly 10 may further include other elements to achieve the function. For example, the control assembly 10 may further include a pressure transducer 15 coupled to the charge chamber 11. The pressure in the charge chamber 11 is monitored by the pressure transducer when the inlet valve 12 is open.

In some embodiments of the present disclosure, the input gas may be a carrier gas. In other embodiments of the present disclosure, the input gas may be a reactant gas. The chemical dosage in the input gas is gathered and held in the charge chamber 11. The volume of the charge chamber 11 is designed to be sufficiently large to hold chemical dosage required for one pulse. When the input gas flow is injected continuously into the charge chamber 11, the line pressure of the gas line 110 increases with time. For a reactant gas, the chemical dosage held by the charge chamber 11, in moles, equals to $P_{Line} V/RT$, where $P_{Line}$ is the line pressure, V is the volume of the charge chamber 11, R is the ideal gas constant and T is the absolute temperature of the charge chamber 11. Increasing the input gas flow and/or charge time results in increasing dosage held by the charge chamber 11. For a carrier gas, the chemical dosage of the carried precursor, held by the charge volume 11, increases with the carrier gas flow and the charge time until the partial pressure of the carried vapor reaches the vapor pressure in the precursor tank. The maximum accumulation for a carried vapor in the charge chamber 11 is $P_0 V/RT$, where $P_0$ is the vapor pressure of the precursor in the precursor tank, V is the volume of the charge chamber 11, R is the ideal gas constant and T is the absolute temperature of the charge chamber 11.

When the control assembly 10 operates, the inlet valve 12 and the outlet valve 13 (or the outlet valve 14) are sequentially activated. That is, when the inlet valve 12 is activated, the outlet valves 13 and 14 are deactivated. When one of the outlet valves 13 and 14 is activated, the inlet valve 12 and the other outlet valve are deactivated.

Specifically, when the inlet valve 12 is activated, the input gas is charged into the charge chamber 11. In the meantime, the outlet valves 13 and 14 are deactivated. When the outlet valve 13 is activated, the input gas in the charge chamber 11 is released into the process chamber. In the meantime, the inlet valve 12 and the outlet valve 14 are deactivated. When the outlet valve 14 is activated, the input gas in the charge chamber 11 is released into the dump line. In the meantime, the inlet valve 12 and the outlet valve 13 are deactivated.

Regardless of which outlet valve is activated, the downstream pressure should be much lower than the pressure in the charge chamber 11 at the onset of the release step. Hence, the release step can be completed within a fraction of a second. In addition, the line pressure of the gas line 110 is expected to drop momentarily when the inlet valve 12 is activated, and the line pressure will rise when the inlet valve 12 is deactivated during the release step.

In some embodiments of the present disclosure, standard pneumatic on/off valves can be used to implement the inlet valve 12 and the outlet valves 13 and 14. However, the type of valve used to implement the inlet valve 12 and the outlet valves 13 and 14 is not a limitation of the present disclosure.

Figure 2:
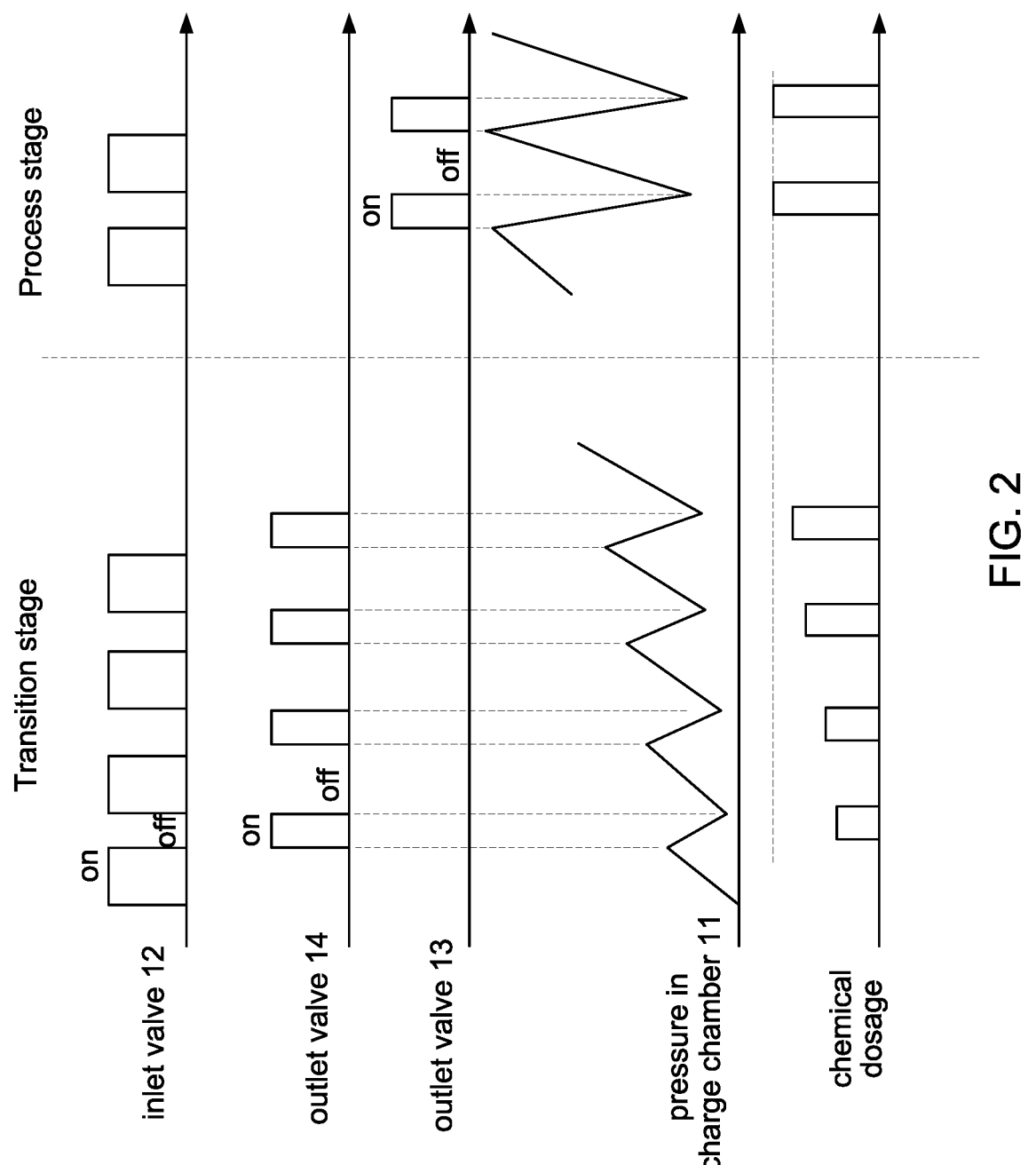
FIG. 2 is a diagram illustrating operations of a control assembly in accordance with an embodiment of the present disclosure.

FIG. 2 is a diagram illustrating operations of the control assembly in accordance with an embodiment of the present disclosure. When the semiconductor processing system (e.g., an ALD system) applying the control assembly 10 starts to operates, the pressure in the charge chamber 11 and the chemical dosage of the input gas will take multiple charge and release cycles before reaching a stable and repeatable state. During the initial and transition stage, the pressure in the charge chamber 11 and the chemical dosage vary from cycle to cycle, which is not suitable for executing an ALD operation. Therefore, the input gas in the charge chamber 11 is not used for the ALD operation and released into the dump line.

Specifically, in the transition stage, activating durations of the inlet valve 12 and the outlet valve 14 are staggered. An activating duration of a valve refers to a period of time in which the valve is open or activated. Moreover, the inlet valve 12 and the outlet valve 14 are sequentially and repeatedly activated. When the inlet valve 12 is activated, the input gas is charged into the charge chamber 11, and the pressure in the charge chamber 11 gradually increases. When the outlet valve 14 is activated, the input gas in the charge chamber 11 is released into the dump line, and the pressure in the charge chamber 11 gradually decreases. By this, a cycle of charge/release in the transition stage is completed.

The transition stage lasts for several cycles of charge/release, wherein the pressure in the charge chamber 11 and the chemical dosage in the input gas gradually stabilize with each cycle of charge/release. After the transition stage, the pressure in the charge chamber 11 and the chemical dosage of the input gas become stable and repeatable for executing the ALD operation, and then a process stage can start. Therefore, in the process stage, the input gas in the charge chamber 11 is used for the ALD operation and released into the process chamber. The line pressure is constantly monitored by the pressure transducer 15, installed upstream from the inlet valve 12, to determine if and when the transition stage has ended and the process stage can start.

Specifically, in the process stage, activating durations of the inlet valve 12 and the outlet valve 13 are staggered. Moreover, the inlet valve 12 and the outlet valve 13 are sequentially and repeatedly activated. When the inlet valve 12 is activated, the input gas is charged into the charge chamber 11, and the pressure in the charge chamber 11 gradually increases. When the outlet valve 13 is activated, the input gas in the charge chamber 11 is released into the process chamber to process the work piece (e.g., a semiconductor wafer), and the pressure in the charge chamber 11 gradually decreases. By this, a cycle of charge/release in the process stage is completed.

Figure 3:
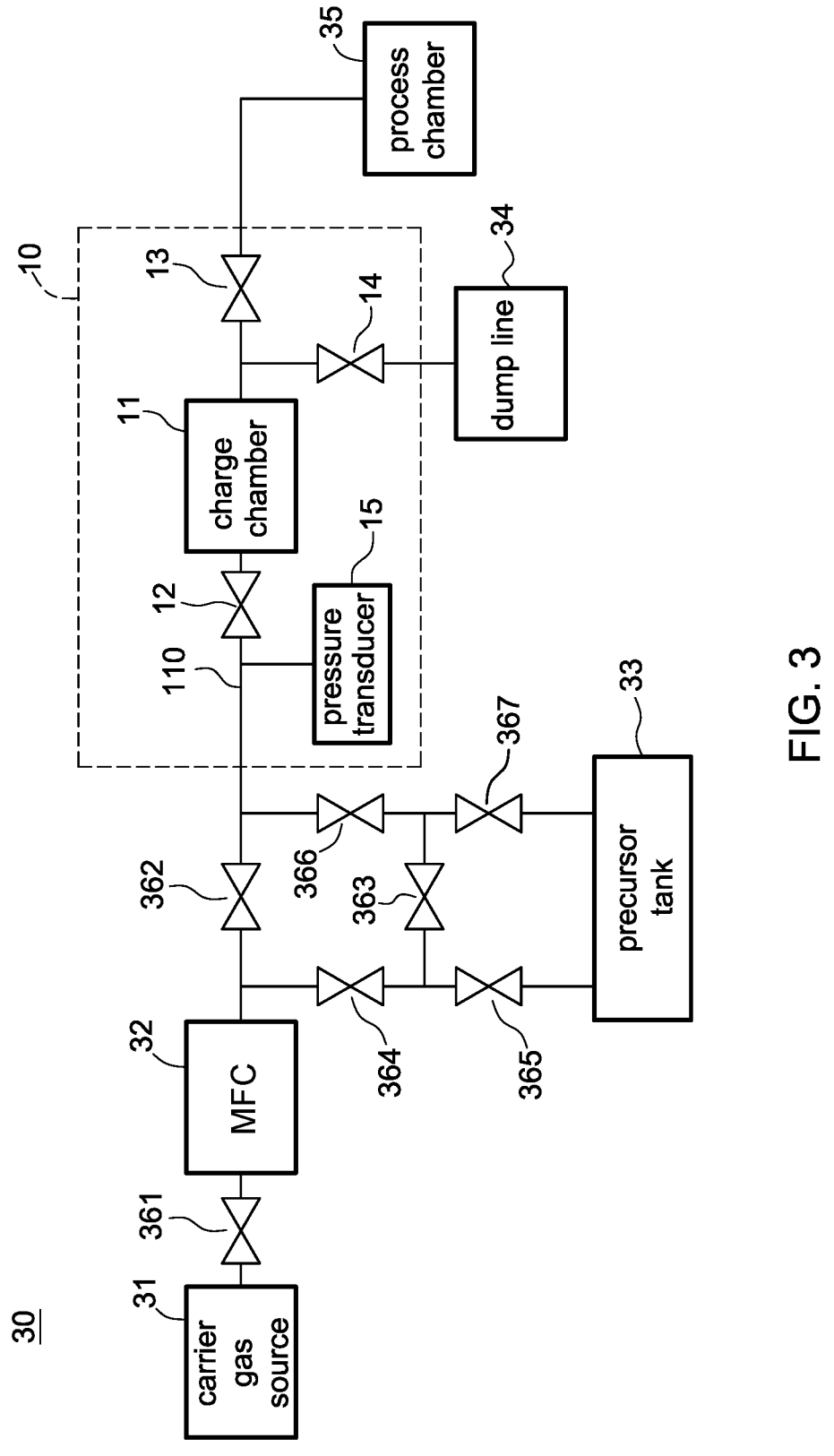
FIG. 3 is a diagram illustrating a semiconductor processing system in accordance with an embodiment of the present disclosure.

FIG. 3 is a diagram illustrating a semiconductor processing system 30 applying the control assembly 10 in accordance with an embodiment of the present disclosure. In addition to the control assembly 10, the semiconductor processing system 30 further includes a precursor subsystem. The precursor subsystem includes a carrier gas source 31, a mass flow controller (MFC) 32, a precursor tank 33, a dump line 34, and a plurality of valves 361 to 367. The semiconductor processing system 30 further includes a process chamber 35.

The carrier gas source 31 provides a carrier gas, as the input gas mentioned above, to the precursor tank 33 via the MFC 32 when the valve 361 is activated. The precursor tank 33 is coupled between the MFC 32 and the control assembly 10 via the valves 362 to 367. The precursor tank 33 receives the carrier gas and provides precursor vapor in the carrier gas. The dump line 34 and the process chamber 35 are respectively coupled to the outlet valves 14 and 13 of the control assembly 10. The functions of the dump line 34 and the process chamber 35 are described in the embodiment of FIG. 2. The detailed description is omitted here for brevity.

When the semiconductor processing system 30 starts to operate, the carrier gas source 31 is turned on to provide the carrier gas, and the flow rate of the carrier gas is set for the MFC 32. The carrier gas flows into the precursor tank 33 and carries precursor vapor out into the gas line 110. After a predetermined time period of initial charge/release cycles (i.e., the transition stage), the continuous operation of the sequential charge and release process (i.e., the process stage) described in the embodiment of FIG. 2 will be executed.

If the precursor tank 33 is properly designed and operated, the carrier gas provided by the carrier gas source 31 should enter the charge chamber 11 with saturated precursor. The molar flow rate of the saturated precursor equals to the carrier molar flow rate divided by $(P_{Line}/(P_0-P_V)-1)$, where $P_{Line}$ and $P_V$ are the total pressure and the precursor partial pressure of the gas line 110, respectively, and $P_0$ is the vapor pressure in the precursor tank 33. As $P_{Line}$ and $P_V$ increase gradually during charging, the molar flow rate of the carried precursor will decrease with time. The rate of precursor accumulation will diminish when $P_V$ approaches $P_0$ after a prolonged charge. Therefore, the maximum precursor dosage that can be accumulated in the charge chamber 11 equals to $P_0$ V/RT. The volume of the charge chamber should be as large as possible to allow high maximum dosage while the carrier gas flow rate should be as high as possible to allow fast dosage accumulation. The optimal choice for the volume of the charge chamber and the carrier gas flow rate shall result in precise and consistent accumulation during each charge step and discharge during each release step.

In some embodiments, the semiconductor processing system 30 can further operates in an offline purge stage, in which the carrier gas is used as the purge gas to remove any remaining precursor molecules in the gas line 110. This type of purge is critical in maintaining cleanliness and safety for precursors with strong reactivity with oxygen/moisture and to prevent unavoidable condensation/accumulation of low vapor pressure precursors on the cold spots in the gas line 110.

Specifically, in the offline purge stage, the valves 365 and 367 are deactivated while the valves 362, 363, 364, and 366, the inlet valve 12 and the outlet valve 14 are activated, which provides a pathway for offline purging of the gas line 110 and the charge chamber 11. Alternatively, the valves 365 and 367 can be manual valves and remain open during the offline purge stage when the valves 364, 363 and 366 are deactivated while the valve 362, the inlet valve 12 and the outlet valve 14 are activated to facilitate offline purging of the gas line 110 and the charge chamber 11.

Figure 4A:
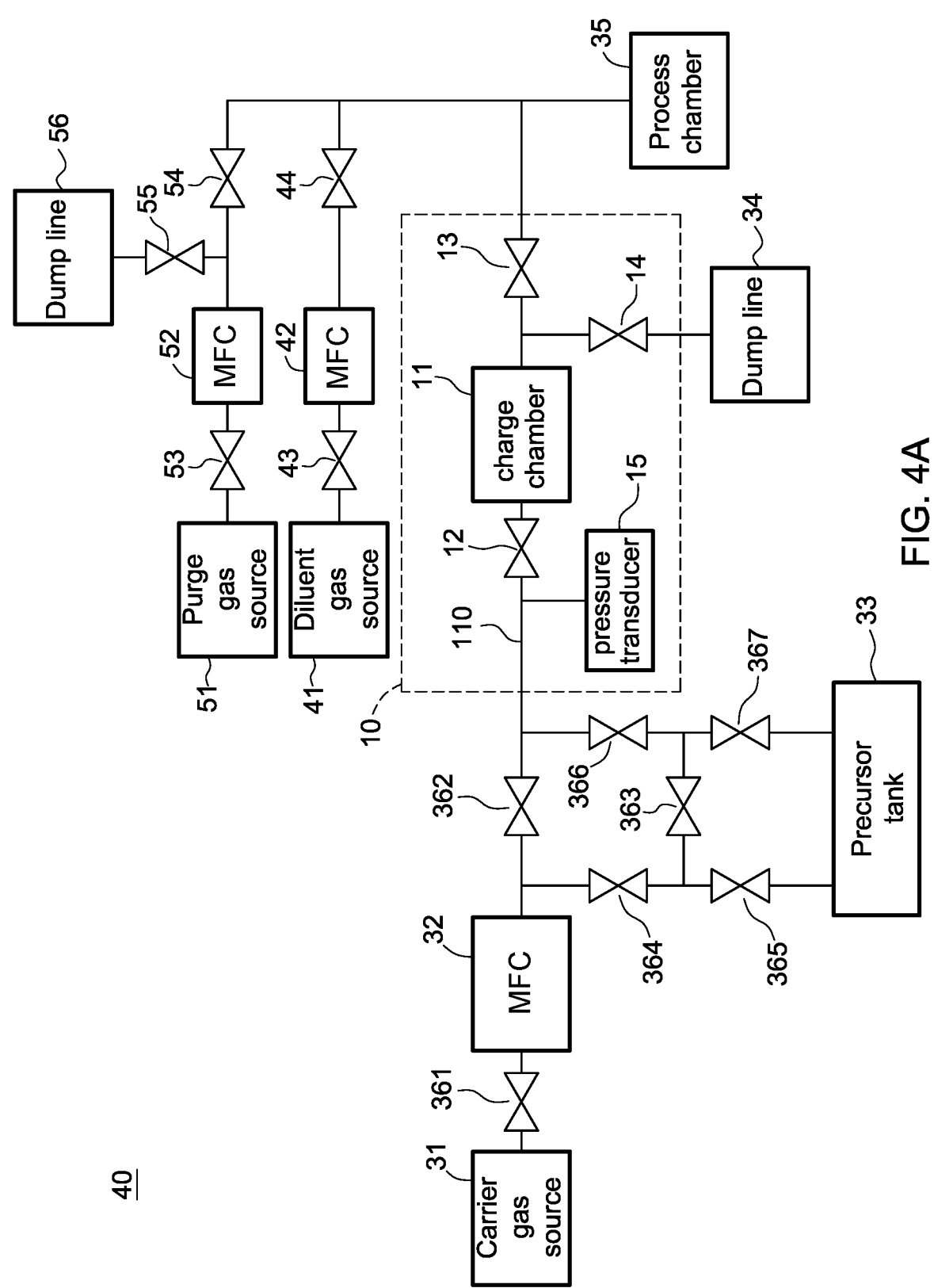
FIG. 4A is a diagram illustrating a semiconductor processing system in accordance with another embodiment of the present disclosure.

FIG. 4A is a diagram illustrating a semiconductor processing system 40 applying the control assembly 10 in accordance with an embodiment of the present disclosure. The semiconductor processing system 40 is similar to the semiconductor processing system 30 described and illustrated in the embodiment of FIG. 3 except that the semiconductor processing system 40 further includes a diluent gas subsystem and a purge gas subsystem. The diluent gas subsystem includes a diluent gas source 41, a MFC 42, a diluent inlet valve 43 and a diluent outlet valve 44. The diluent gas subsystem provides a continuous stream of inert gas to the process chamber 35 when the diluent inlet valve 43 and the diluent outlet valve 44 are activated. The purge gas subsystem includes a purge gas source 51, a MFC 52, a purge inlet valve 53 and two purge outlet valves 54 and 55. The purge gas source 51 provides a purge gas to the process chamber 35, when the purge inlet valve 53 and the purge outlet valve 54 are activated and the purge outlet valve 55 is deactivated. Alternatively, the purge gas flow is diverted to the dump line 56 when the purge inlet valve 53 and the purge outlet valve 55 are activated and the purge outlet valve 54 is deactivated. The diluent gas subsystem and the purge gas subsystem are used for processing as well as for cleaning. The similarities between the semiconductor processing system 40 and the semiconductor processing system are omitted here for brevity.

Figure 4B:
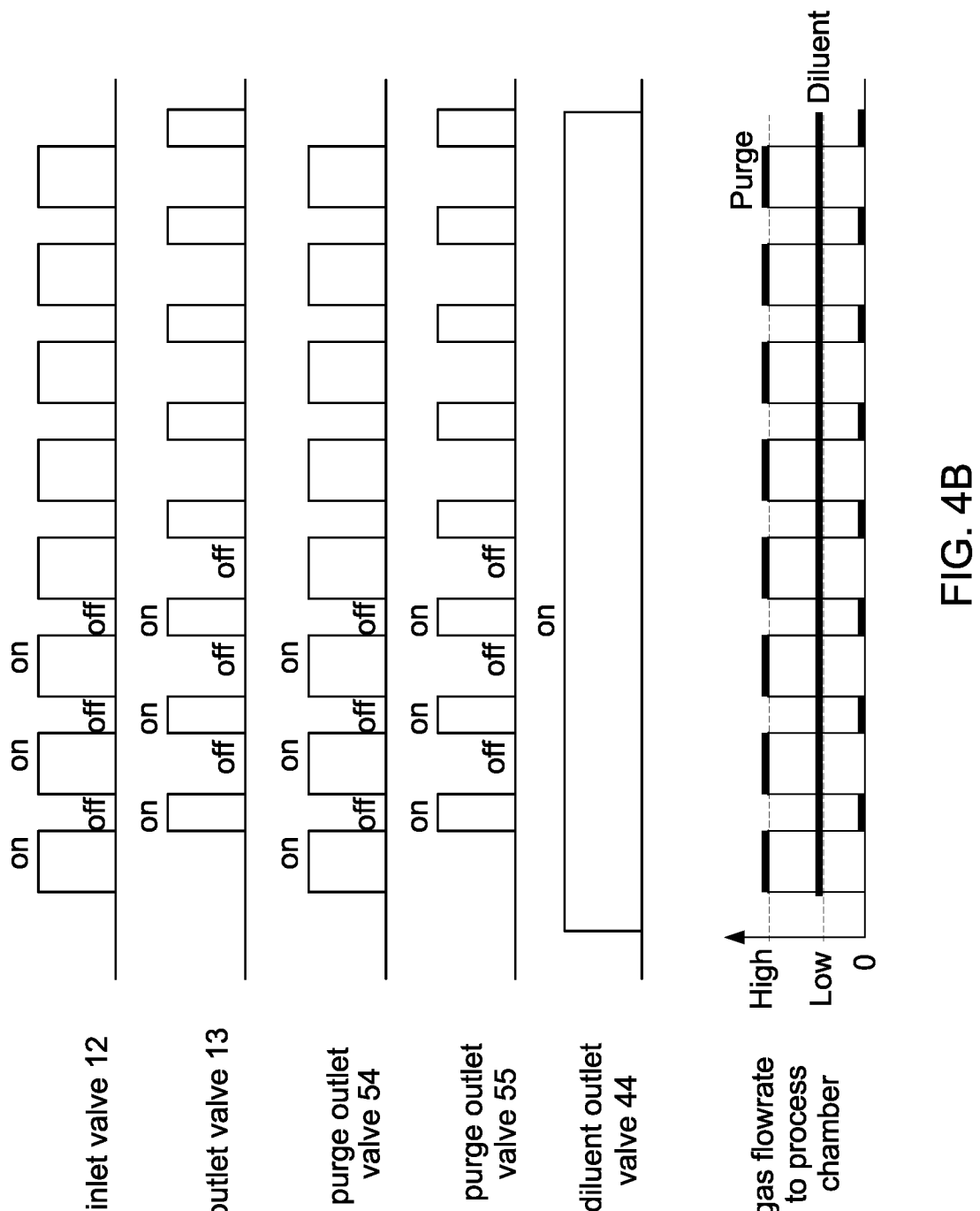
FIG. 4B is a diagram illustrating the cooperation of a precursor subsystem, a diluent gas subsystem and a purge gas subsystem in a process stage in accordance with an embodiment of the present disclosure.

FIG. 4B is a diagram illustrating the cooperation of the precursor subsystem, the diluent gas subsystem and the purge gas subsystem in the process stage in accordance with an embodiment of the present disclosure. The operations of the precursor subsystem and the control assembly are similar to those described and illustrated in FIGS. 2 and 3.

Referring to FIG. 4B in conjunction with FIG. 4A, in the process stage, when the inlet valve 12 and the purge outlet valve 54 are activated at the same time, the purge gas source 51 provides a high flow rate of purge gas to the charge chamber 11. On the other hand, when the outlet valve 13 and the purge outlet valve 55 are activated at the same time, the purge gas is diverted to the dump line while the dosage is released from the charge chamber 11 to the process chamber 35. During the charge release step, the diluent gas source 41 provides a low flow rate of diluent gas to the released charge before entering the process chamber 35.

The mass flow rate of the diluent gas is selected to achieve the best possible chemical distribution and film uniformity on the working piece under processing. The mass flow rate of the purge gas is selected so that the remaining precursor vapor in the gas line and in the process chamber 35 can be quickly swept away. Both the diluent and the purge gas can be the same inert gas, such as N2, Ar or He, and introduced downstream from the outlet valve 13 but before the process chamber 35.

Figure 5A:
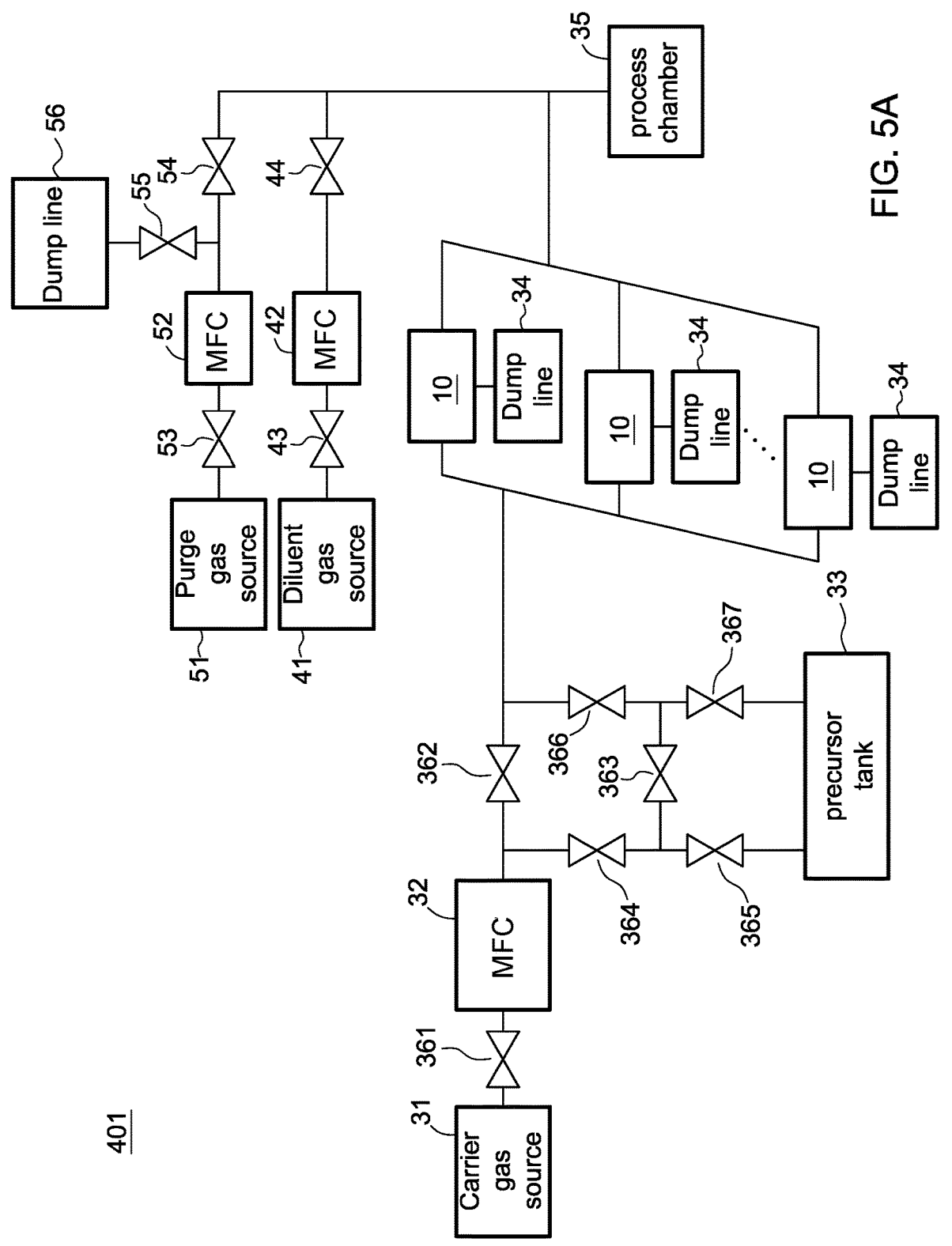
FIG. 5A is a diagram illustrating a semiconductor processing system in accordance with another embodiment of the present disclosure.

FIG. 5A is a diagram illustrating a semiconductor processing system 401 applying the control assembly 10 in accordance with an embodiment of the present disclosure. The semiconductor processing system 401 is similar to the semiconductor processing system 40 described and illustrated in the embodiment of FIG. 4A except that the semiconductor processing system 401 includes a plurality of control assemblies 10 connected to the process chamber 35.

When a control assembly 10 operates in the release step, i.e., the outlet valve 13 is activated to release the carrier gas in the charge chamber 11 to the process chamber 35, the other control assemblies 10 operate in the charge step, i.e., the inlet valve 12 is activated to charge the carrier gas into the charge chamber 11. In this embodiment, the plurality of control assemblies 10 sequentially operate in the release step. Those skilled in the art should understand that the plurality of control assemblies 10 ensure dosage scalability, which allows convenient and expedient process optimization during process development and quick adjustment during manufacturing when changes, such as surface area and/or film performance requirements, occur, requiring fine tuning for chemical dosage.

It should be noted that, in other embodiments, the operator can determine how many control assemblies will be used together at the same time for one process chamber 35. For example, two control assemblies 10 in the semiconductor processing system 401 operate in the release step at the same time, and other control assemblies 10 in the semiconductor processing system 401 operate in the charge step.

Figure 5B:
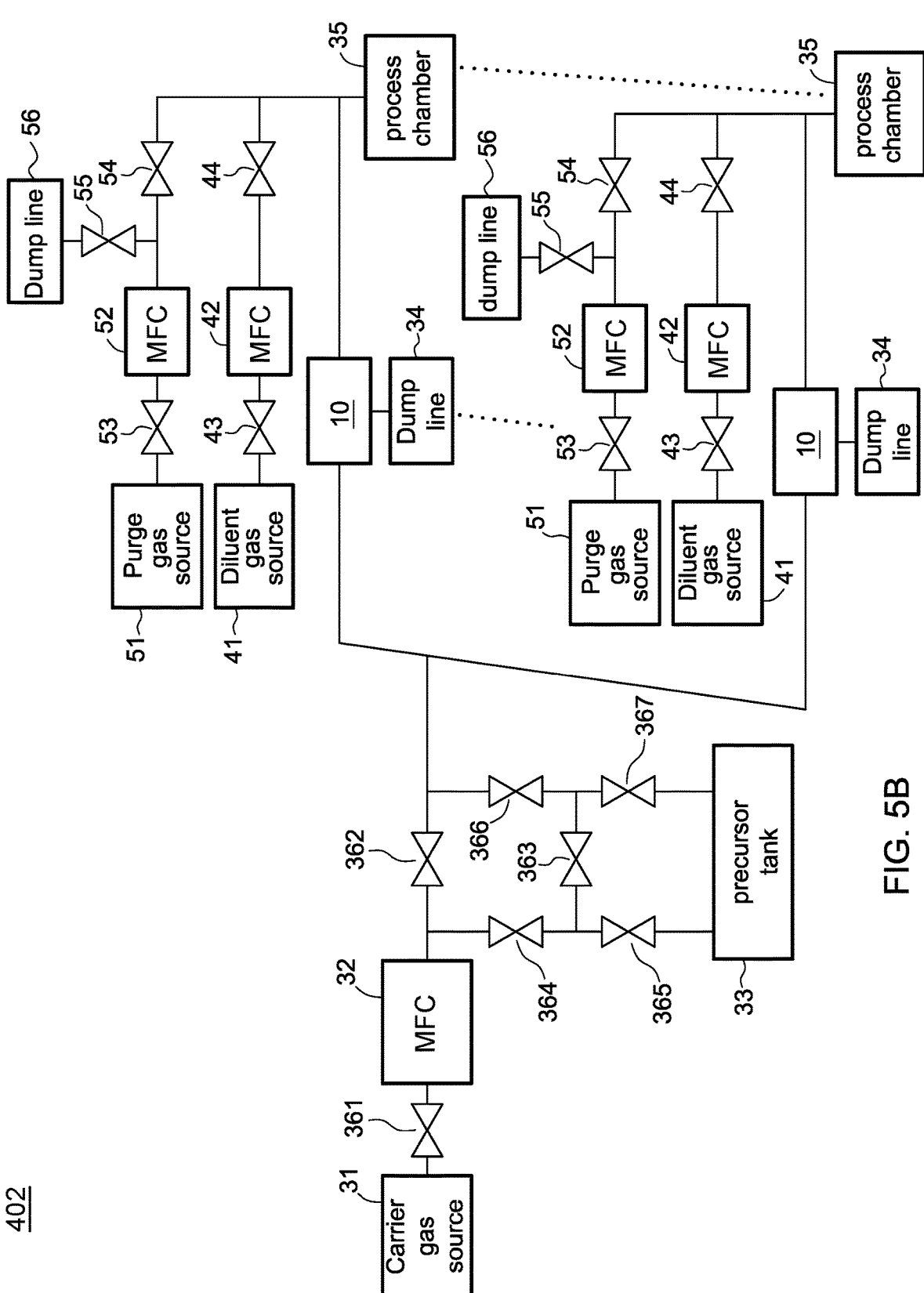
FIG. 5B is a diagram illustrating a semiconductor processing system in accordance with another embodiment of the present disclosure.

FIG. 5B is a diagram illustrating a semiconductor processing system 402 applying the control assembly 10 in accordance with an embodiment of the present disclosure. The semiconductor processing system 402 is similar to the semiconductor processing system 40 described and illustrated in the embodiment of FIG. 4A except that the semiconductor processing system 402 includes a plurality of control assemblies 10, a plurality of diluent gas subsystems, a plurality of purge gas subsystems, and a plurality of process chambers 35. Each process chamber 35 corresponds to a control assembly 10, a diluent gas subsystem and a purge gas subsystem.

The semiconductor processing system 402 can selectively operates in a parallel mode or a sequential mode. When the semiconductor processing system 402 operates in the parallel mode, each control assembly 10 is assigned to the corresponding process chamber 35. The control assemblies 10 can perform charge/release step in parallel, therefore, semiconductor processing procedures in all process chambers 35 can be performed simultaneously.

When the semiconductor processing system 402 operates in the sequential mode, each control assembly is programmed to serve the process chambers 35 sequentially. For example, assuming the semiconductor processing system 402 includes two control assemblies 10 and two process chambers 35, one control assembly 10 is used for the first process chamber 35 first, followed by the other control assembly 10 used for the second process chamber 35 in alternating release cycles. The sequential mode allows more charge time and higher release dosage while each process chamber 35 take turns in receiving the dosage.

Based on the dosage requirement and the number of process chambers in the system, the operator can determine how many control assemblies 10 will be used together at the same time and the sequence of operation for each control assembly.

The concepts illustrated for FIGS. 5A and 5B can be further combined together to achieve unlimited flexibility and precision in dosage delivery to one or many process chambers—all with a single set of carrier gas source, MFC and precursor tank, allowing the maximum dosage control capability at the lowest cost.

Figure 6:
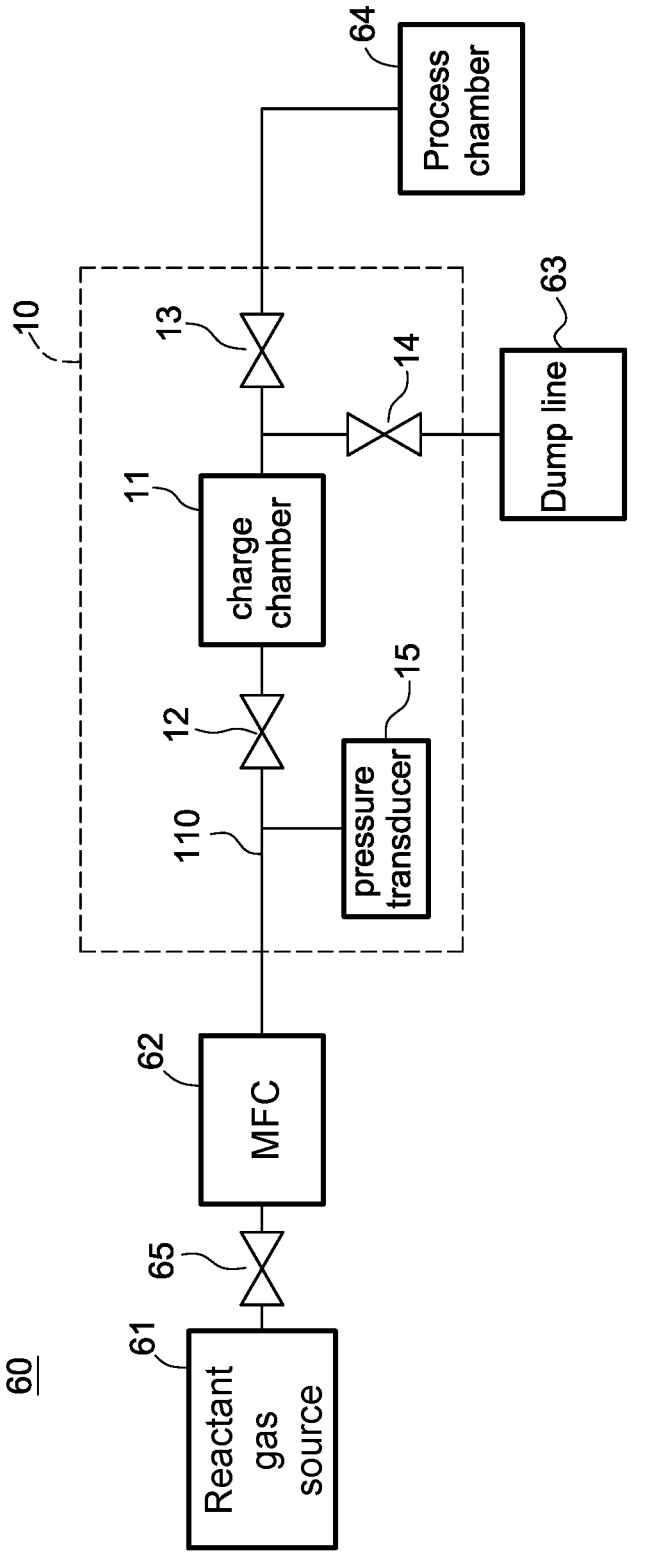
FIG. 6 is a diagram illustrating a semiconductor processing system in accordance with another embodiment of the present disclosure.

FIG. 6 is a diagram illustrating a semiconductor processing system 60 applying the control assembly 10 in accordance with an embodiment of the present disclosure. In addition to the control assembly 10, the semiconductor processing system 60 further includes a reactant subsystem. The reactant subsystem includes a reactant gas source 61, a MFC 62, a dump line 63, and a valve 65. The reactant gas source 61 provides a reactant gas, as the input gas mentioned above, to the control assembly 10 via the MFC 62 when the valve 65 is activated. The semiconductor processing system 60 further includes a process chamber 64. The functions of the dump line 63 and the process chamber 64 are described in the embodiment of FIG. 2.

When the semiconductor processing system 60 starts to operate, the reactant gas source 61 is turned on to provide the reactant gas, and the flow rate of the reactant gas is set for the MFC 62. The reactant gas flows into the gas line 110 of the control assembly 10. After a predetermined time period of initial charging (i.e., the transition stage), the continuous operation of the sequential charge and release process (i.e., the process stage) described in the embodiment of FIG. 2 will be executed.

For gaseous reactants, the volume of the charge chamber 11 should be sufficiently large to prevent sharp pressure rise approaching 1 atm. Since the pressure rise is determined by mass flow rate times cycle time divided by the charge volume. The volume of the charge chamber 11 can be easily determined by setting an upper pressure rise limit such as around 100-500 torr.

Those skilled in the art should readily understand that, after reading the embodiments of FIGS. 4A, 5A and 5B, the semiconductor processing system 60 can be expanded as the semiconductor processing system 40, 401 or 402. The detailed description is omitted here for brevity.

Figure 7:
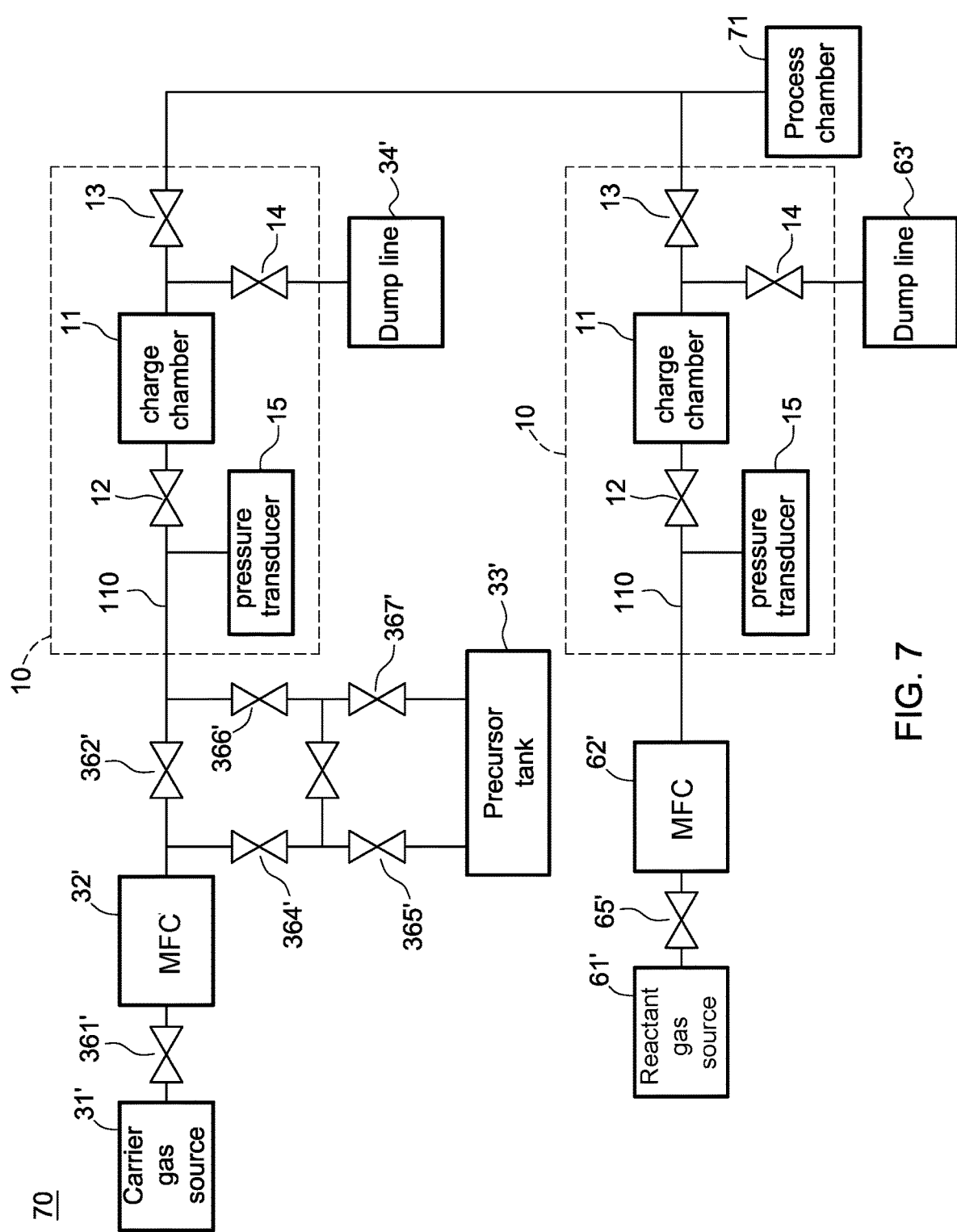
FIG. 7 is a diagram illustrating a semiconductor processing system in accordance with another embodiment of the present disclosure.

FIG. 7 is a diagram illustrating a semiconductor processing system 70 applying the control assembly 10 in accordance with an embodiment of the present disclosure. The semiconductor processing system 70 includes a precursor subsystem which includes a carrier gas source 31', a MFC 32', a precursor tank 33', a dump line 34', and a plurality of valves 361' to 367'. The precursor subsystem of the semiconductor processing system 70 is similar to that described and illustrated in the embodiment of FIG. 3. Therefore, the detailed description of each element is omitted here.

The semiconductor processing system 70 further includes a reactant subsystem which includes a reactant gas source 61', a MFC 62', a dump line 63', and a valve 65'. The reactant subsystem of the semiconductor processing system 70 is similar to that described and illustrated in the embodiment of FIG. 6. Therefore, the detailed description of each element is omitted here.

The precursor subsystem and the reactant subsystem are connected, via respective control assemblies 10, to a process chamber 71 for executing semiconductor processing such as an ALD operation. Specifically, the outlet valves 13 of the precursor subsystem and the reactant subsystem are connected to a process chamber 71.

When the semiconductor processing system 70 operates in the transition stage, the inlet valve 12 and the outlet valve 14 of the precursor subsystem are sequentially and repeatedly activated to release the carrier gas in the charge chamber 11 of the precursor subsystem until the pressure and the chemical dosage are stable. Likewise, when the semiconductor processing system 70 operates in the transition stage, the inlet valve 12 and the outlet valve 14 of the reactant subsystem are sequentially and repeatedly activated to release the reactant gas in the charge chamber 11 of the reactant subsystem until the pressure and the chemical dosage are stable. The operations of the precursor subsystem and the reactant subsystem in the transition stage are described in the embodiment of FIG. 2. The detailed description is omitted here for brevity.

Figure 8:
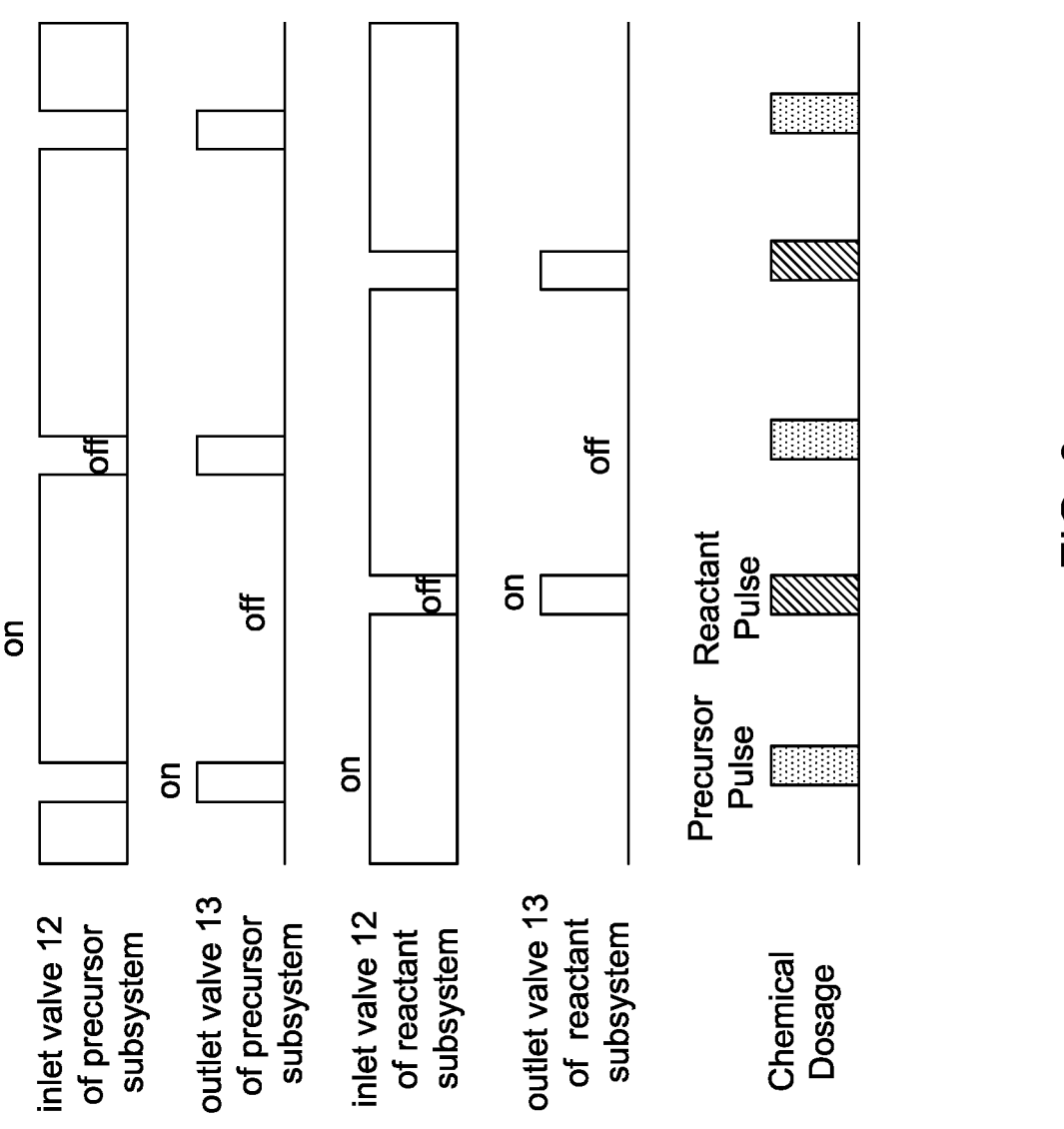
FIG. 8 is a diagram illustrating the cooperation of a precursor subsystem and a reactant subsystem in a process stage in accordance with an embodiment of the present disclosure.

FIG. 8 is a diagram illustrating the cooperation of the precursor subsystem and the reactant subsystem in the process stage in accordance with an embodiment of the present disclosure. Referring to FIG. 8 in conjunction with FIG. 7, for the precursor subsystem, in the process stage, the activating durations of the inlet valve 12 and the outlet valve 13 are staggered. Specifically, the inlet valve 12 and the outlet valve 13 are sequentially and repeatedly activated. Moreover, the precursor pulse is generated for executing the ALD operation when the outlet valve 13 is activated.

Likewise, for the reactant subsystem, in the process stage, the activating durations of the inlet valve 12 and the outlet valve 13 are staggered. Specifically, the inlet valve 12 and the outlet valve 13 are sequentially and repeatedly activated. Moreover, the reactant pulse is generated for executing the ALD operation when the outlet valve 13 is activated. Furthermore, the activating durations of the outlet valves 13 of the precursor subsystem and the reactant subsystem are staggered. Specifically, the outlet valves 13 of the precursor subsystem and the reactant subsystem are sequentially and repeatedly activated.

Figure 9:
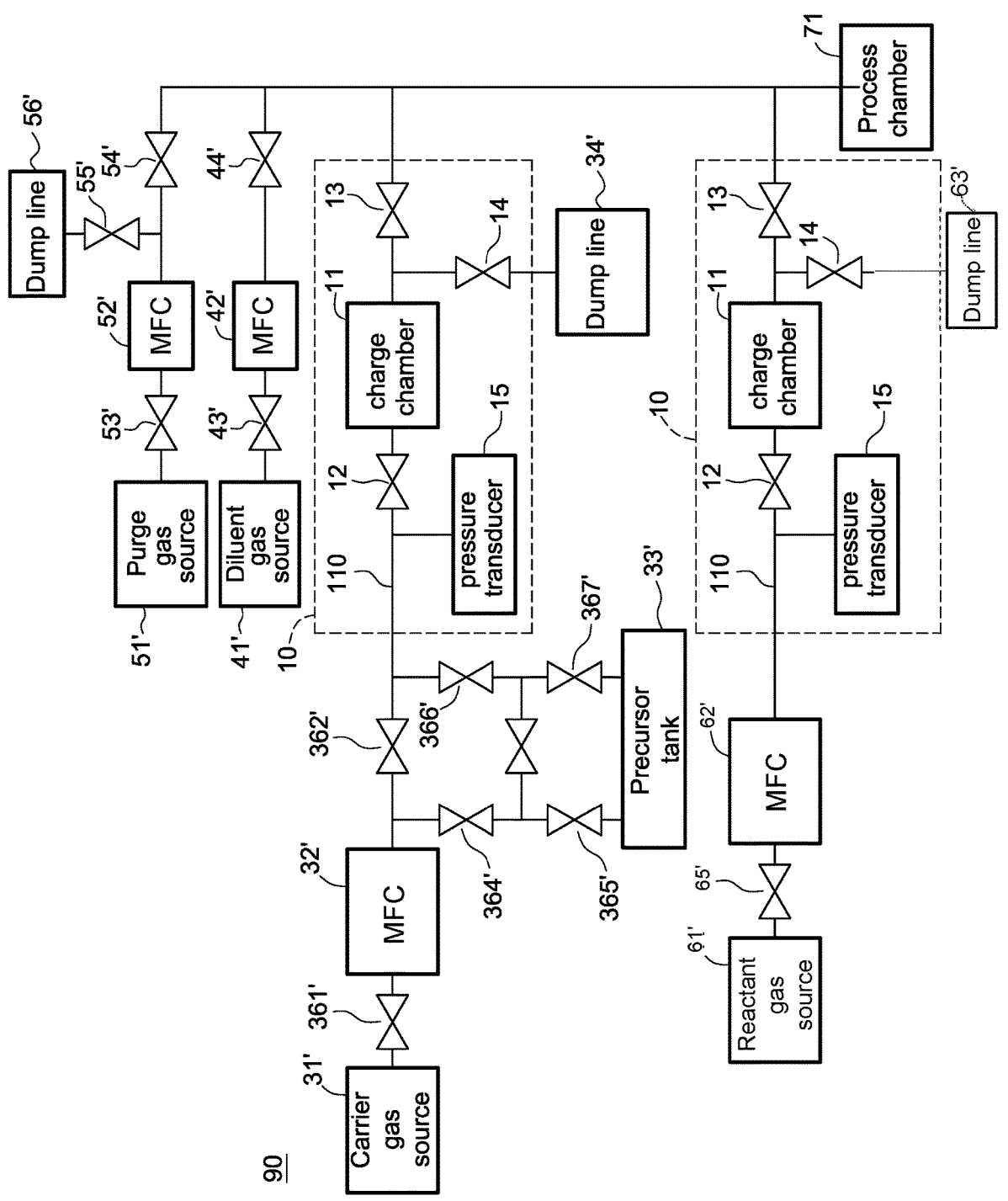
FIG. 9 is a diagram illustrating a semiconductor processing system in accordance with another embodiment of the present disclosure.

FIG. 9 is a diagram illustrating a semiconductor processing system 90 applying the control assembly 10 in accordance with an embodiment of the present disclosure. The semiconductor processing system 90 is similar to the semiconductor processing system 70 described and illustrated in the embodiment of FIG. 7 except that the semiconductor processing system 90 further includes a diluent gas subsystem and a purge gas subsystem. The diluent gas subsystem includes a diluent gas source 41', a MFC 42', a diluent inlet valve 43' and a diluent outlet valve 44'. The purge gas subsystem includes a purge gas source 51', a MFC 52', a purge inlet valve 53' and two purge outlet valves 54' and 55'. The diluent gas and the purge gas subsystems of the semiconductor processing system 90 are similar to the diluent gas and the purge gas subsystems described and illustrated in the embodiment of FIG. 4A.

Figure 10:
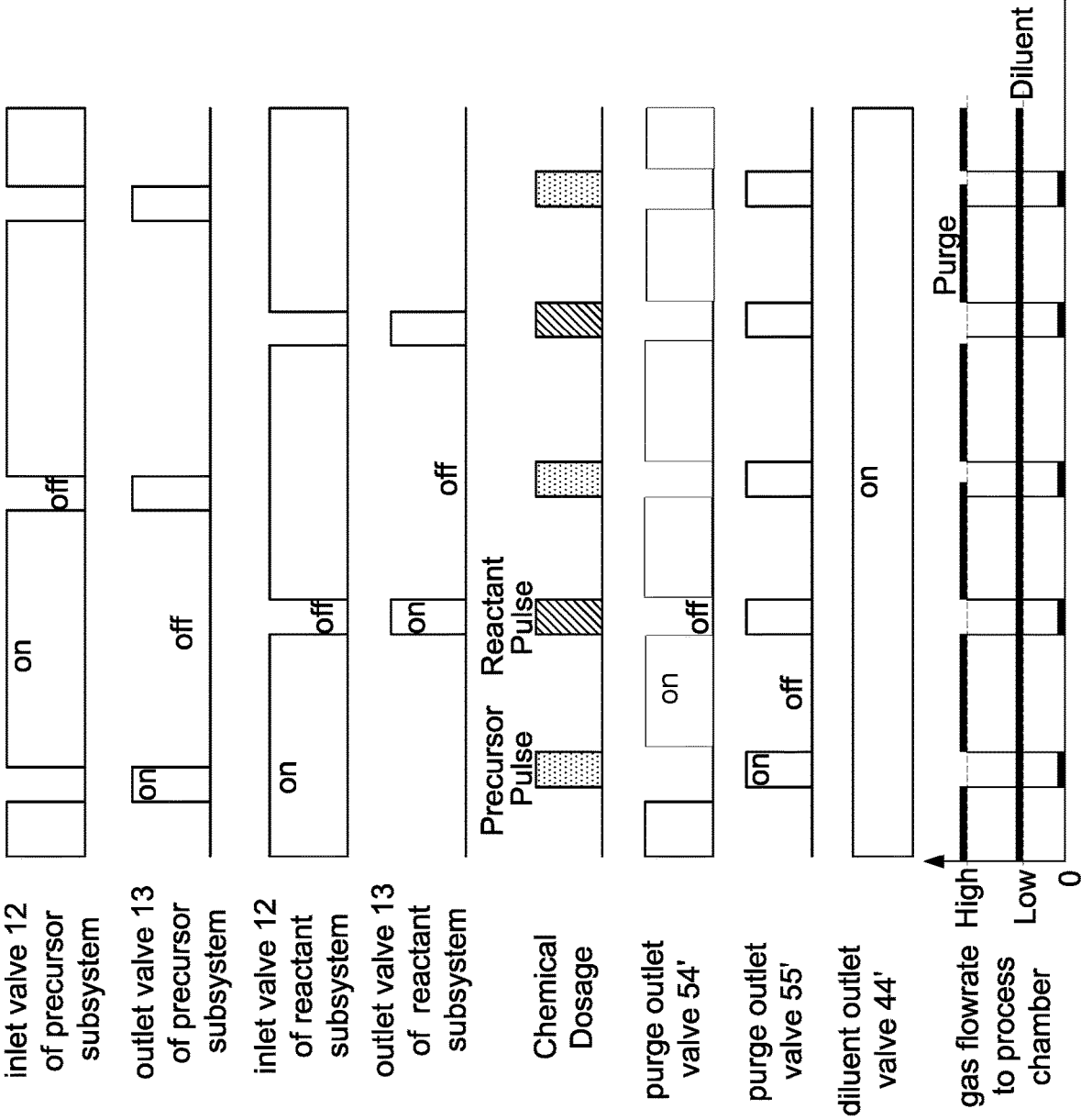
FIG. 10 is a diagram illustrating the cooperation of a diluent gas subsystem, a purge gas subsystem, a precursor subsystem and a reactant subsystem in a process stage in accordance with an embodiment of the present disclosure.

FIG. 10 is a diagram illustrating the cooperation of the diluent gas and the purge gas subsystems, the precursor subsystem and the reactant subsystem in the process stage in accordance with an embodiment of the present disclosure. The operations of the precursor subsystem and the reactant subsystem are similar to that described and illustrated in FIG. 8. The operations of the precursor subsystem and the reactant subsystem are omitted here for brevity.

Referring to FIG. 10 in conjunction with FIG. 9, in the process stage, the purge gas source 51' provides the purge gas with a high flow rate when the inlet valve 12 of the precursor subsystem, the inlet valve 12 of the reactant subsystem and the purge outlet valve 54' are activated. On the other hand, in the process stage, the diluent gas source 41' provides the diluent gas with a low flow rate when the diluent outlet valve 44' of the diluent gas subsystem is activated.

While this disclosure has been described with specific embodiments thereof, it is evident that many alternatives, modifications, and variations may be apparent to those skilled in the art. For example, various components of the embodiments may be interchanged, added, or substituted in the other embodiments. Also, all of the elements of each figure are not necessary for operation of the disclosed embodiments. For example, those having ordinary skills in the art would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

What is claimed is:

1. A method of controlling a semiconductor processing system including a control assembly coupled between a mass flow controller (MFC) and a process chamber, the method comprising:

operating in a process stage, comprising:

providing an input gas from a gas source to a precursor tank via the MFC and a first inlet valve located between the MFC and the precursor tank, the precursor tank coupled between the MFC and the control assembly and providing a precursor vapor in the inlet gas to allow the input gas carrying the precursor vapor;

activating a second inlet valve of the control assembly coupled between the gas source and a charge chamber of the control assembly to charge the charge chamber with the input gas carrying the precursor vapor; and activating a first outlet valve of the control assembly coupled between the charge chamber and the process chamber to release the input gas in the charge chamber into the process chamber;

operating in a transition stage, comprising:

activating the second inlet valve to charge the charge chamber with the input gas carrying the precursor vapor; and activating a second outlet valve of the control assembly coupled between the charge chamber and a dump line; and operating in an offline purging stage, comprising:

deactivating the first inlet valve and activating the second inlet valve and the second outlet valve of the control assembly to clean a gas line coupled between the gas source and the charge chamber by using the input gas.

2. The method of claim 1, wherein activating durations of the second inlet valve and the first outlet valve are staggered in the process stage.

3. The method of claim 2, wherein the second inlet valve and the first outlet valve are activated sequentially and repeatedly in the process stage.

4. The method of claim 1, wherein activating durations of the second inlet valve and the second outlet valve are staggered in the transition stage.

5. The method of claim 4, wherein the second inlet valve and the second outlet valve are activated sequentially and repeatedly in the transition stage.

6. The method of claim 1, wherein the gas source is a carrier gas source, the input gas is a carrier gas, the control assembly is a first control assembly, the semiconductor processing system further includes a second control assembly coupled between a reactant gas source and the process chamber, and operating in the process stage further comprises:

activating an inlet valve of the second control assembly coupled between the reactant gas source and a charge chamber of the second control assembly to charge the charge chamber of the second control assembly with a reactant gas from the reactant gas source; and activating an outlet valve of the second control assembly coupled between the charge chamber of the second control assembly and the process chamber to release the reactant gas into the process chamber.

7. The method of claim 6, wherein activating durations of the inlet valve of the second control assembly and the outlet valve of the second control assembly are staggered in the process stage.

8. The method of claim 7, wherein the inlet valve of the second control assembly and the outlet valve of the second control assembly are activated sequentially and repeatedly in the process stage.

9. The method of claim 8, wherein activating durations of the first outlet valve of the first control assembly and the outlet valve of the second control assembly are staggered.

10. The method of claim 9, wherein operating in the process stage further comprises:

providing a purge gas into the process chamber with a first flow rate when the second inlet valve of the first control assembly and the inlet valve of the second control assembly are both activated and the first outlet valve of the first control assembly and the outlet valve of the second control assembly are both deactivated; and providing the purge gas into a dump line when the outlet valve of the first control assembly or the outlet valve of the second control assembly is activated.

11. The method of claim 10, wherein operating in the process stage further comprises:

continuously providing a diluent gas into the process chamber with a second flow rate, wherein the first flow rate is higher than the second flow rate.

* * * * *